US011624562B2

(12) United States Patent
Nakamura et al.

(10) Patent No.: US 11,624,562 B2
(45) Date of Patent: Apr. 11, 2023

(54) HEAT SINK

(71) Applicant: FUJI ELECTRIC CO., LTD., Kawasaki (JP)

(72) Inventors: Takumi Nakamura, Shizuoka (JP); Eiji Anzai, Shizuoka (JP); Tomoyuki Hirayama, Shizuoka (JP); Yutaka Hirano, Shizuoka (JP); Ryoichi Kato, Nagano (JP); Hiromichi Gohara, Nagano (JP); Kohei Yamauchi, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/897,506

(22) Filed: Aug. 29, 2022

(65) Prior Publication Data
US 2022/0412670 A1 Dec. 29, 2022

Related U.S. Application Data

(60) Division of application No. 17/123,763, filed on Dec. 16, 2020, which is a continuation of application No. PCT/JP2019/026496, filed on Jul. 3, 2019.

(30) Foreign Application Priority Data

Jul. 3, 2018 (JP) .............................. JP2018-126496

(51) Int. Cl.
*F28F 7/00* (2006.01)
*F28F 3/02* (2006.01)
(Continued)

(52) U.S. Cl.
CPC ................ *F28F 3/025* (2013.01); *F28F 3/04* (2013.01); *F28D 2021/0029* (2013.01); *F28F 2215/04* (2013.01)

(58) Field of Classification Search
CPC .......... F28F 3/025; F28F 3/04; F28F 2215/04; F28D 2021/0029
(Continued)

(56) References Cited

U.S. PATENT DOCUMENTS

2004/0244947 A1 12/2004 Chen
2011/0030217 A1* 2/2011 Morino ................. H01L 23/473
29/890.03
2019/0162483 A1* 5/2019 Ono .......................... F28F 1/04

FOREIGN PATENT DOCUMENTS

EP 2276606 1/2011
JP 2006-245479 A 9/2006
(Continued)

OTHER PUBLICATIONS

PCT/ISA/210; International Search Report dated Sep. 24, 2019 in International (PCT) Application No. PCT/JP2019/026496.
(Continued)

*Primary Examiner* — Claire E Rojohn, III
(74) *Attorney, Agent, or Firm* — Manabu Kanesaka

(57) ABSTRACT

A heat sink includes a base plate; a cover overlapping the base plate; fins, each having a plate-like shape projecting from the base plate in a direction perpendicular to the base plate, located between the base plate and the cover; one or a plurality of first fin groups composed of a plurality of the fins arranged with a gap therebetween in a first direction; and one or a plurality of second fin groups composed of a plurality of the fins arranged with a gap therebetween in the first direction, and adjacent to the first fin group with a gap therebetween in a second direction. Positions in the first direction of the fins belonging to the second fin group are displaced with respect to positions in the first direction of the fins belonging to the first fin group. Each of the fines has an S-shape.

4 Claims, 6 Drawing Sheets

(51) Int. Cl.
*F28F 3/04* (2006.01)
*F28D 21/00* (2006.01)

(58) Field of Classification Search
USPC ........................................................ 165/80.3
See application file for complete search history.

(56) References Cited

FOREIGN PATENT DOCUMENTS

| | | |
|---|---|---|
| JP | 2009-260013 A | 11/2009 |
| JP | 2011-119555 A | 6/2011 |
| JP | 2015-138840 A | 7/2015 |

OTHER PUBLICATIONS

European Patent Office, "Extended European Search Report and Search Opinion of European Patent Application No. 19831272.0" dated Feb. 24, 2022.

* cited by examiner

HEAT SINK

CROSS-REFERENCE TO RELATED APPLICATION

This is a divisional application of Ser. No. 17/123,763 filed on Dec. 16, 2020, which claims the benefit of priority from Japanese Patent Application No. 2018-126496 filed on Jul. 3, 2018 and International Patent Application No. PCT/JP2019/026496 filed on Jul. 3, 2019, the entire contents of which are incorporated herein by reference.

BACKGROUND

1. Technical Field

The present disclosure relates to a heat sink.

BACKGROUND

2. Description of the Related Art

Heat is generated in electronic devices provided with semiconductor elements. The heat generated in electronic devices may slow down processing speeds or cause malfunctions. Thus, in order to remove the heat generated in electronic devices, a heat sink is attached to the electronic devices. For example, Japanese Patent Application Laid-open Publication No. 2015-138840 describes a heat exchanger that has fins in a flow path through which a refrigerant body flows.

The heating value has been increasing along with the improvement of the performance of electronic devices. Meanwhile, electronic devices are desired to be downsized. Thus, a heat sink having high cooling efficiency has been desired.

SUMMARY

According to an aspect, a heat sink includes a base plate; a cover overlapping the base plate; a fin having a plate-like shape projecting from the base plate in a direction perpendicular to the base plate, the fin being located between the base plate and the cover; a first fin group composed of a plurality of the fins arranged with a gap therebetween in a first direction parallel to the base plate; and a second fin group composed of a plurality of the fins arranged with a gap therebetween in the first direction, and adjacent to the first fin group with a gap therebetween in a second direction parallel to an inflow direction of refrigerant and perpendicular to the first direction. A longitudinal direction of the fin is along the second direction. A position in the first direction of the fin belonging to the second fin group is displaced with respect to a position in the first direction of the fin belonging to the first fin group.

DETAILED DESCRIPTION

The following describes an embodiment in detail while referring to the accompanying drawings. Note that the present invention is not intended to be limited by the following embodiment. The constituent elements in the following embodiment include elements easily achieved by a person skilled in the art, elements that are substantially the same, and elements that are within a scope of what is called equivalents. Moreover, the constituent elements disclosed in the following embodiment can be combined as appropriate.

Embodiment

Figure 1:
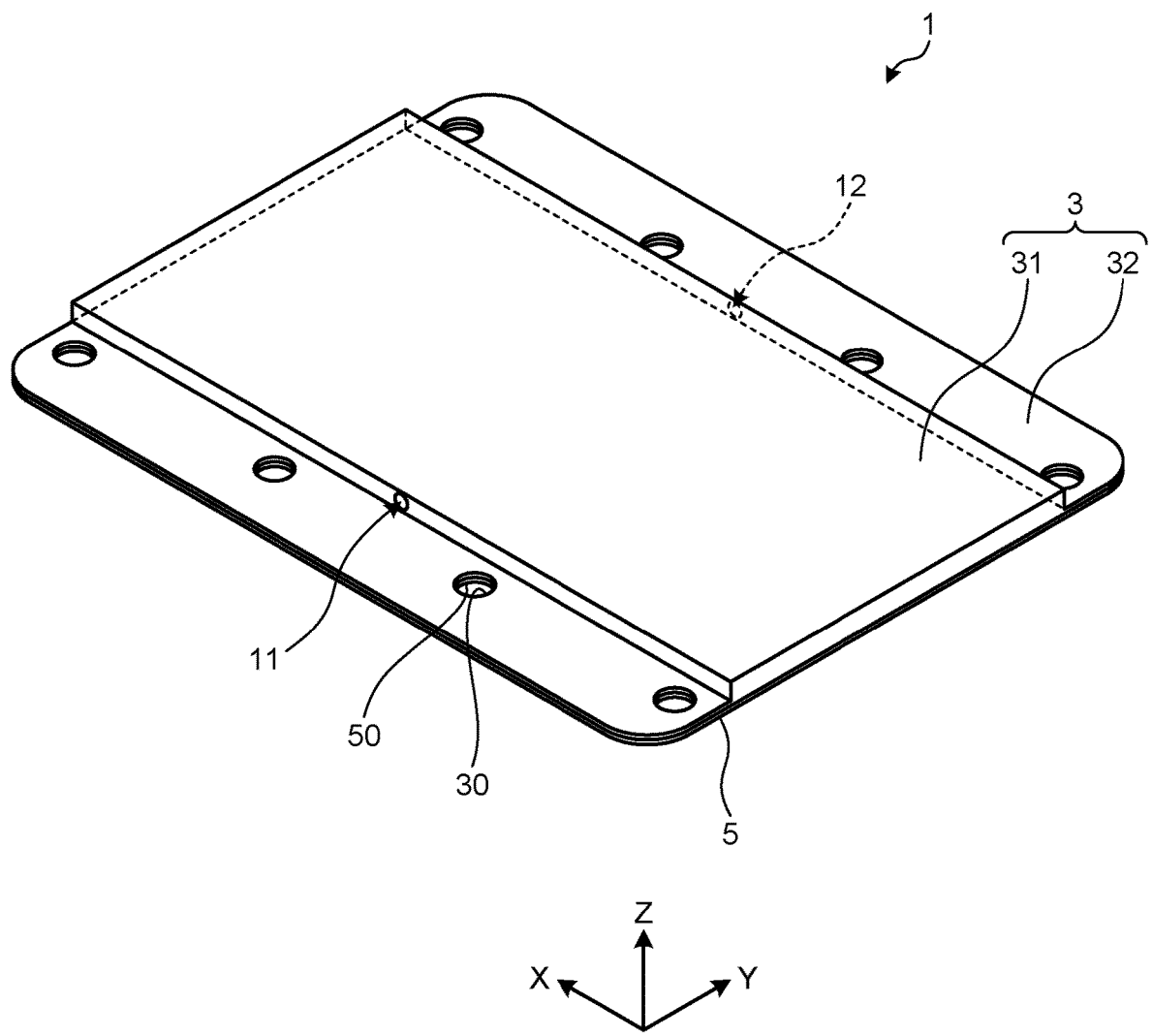
FIG. 1 is a perspective view of a heat sink of the present embodiment.
Figure 2:
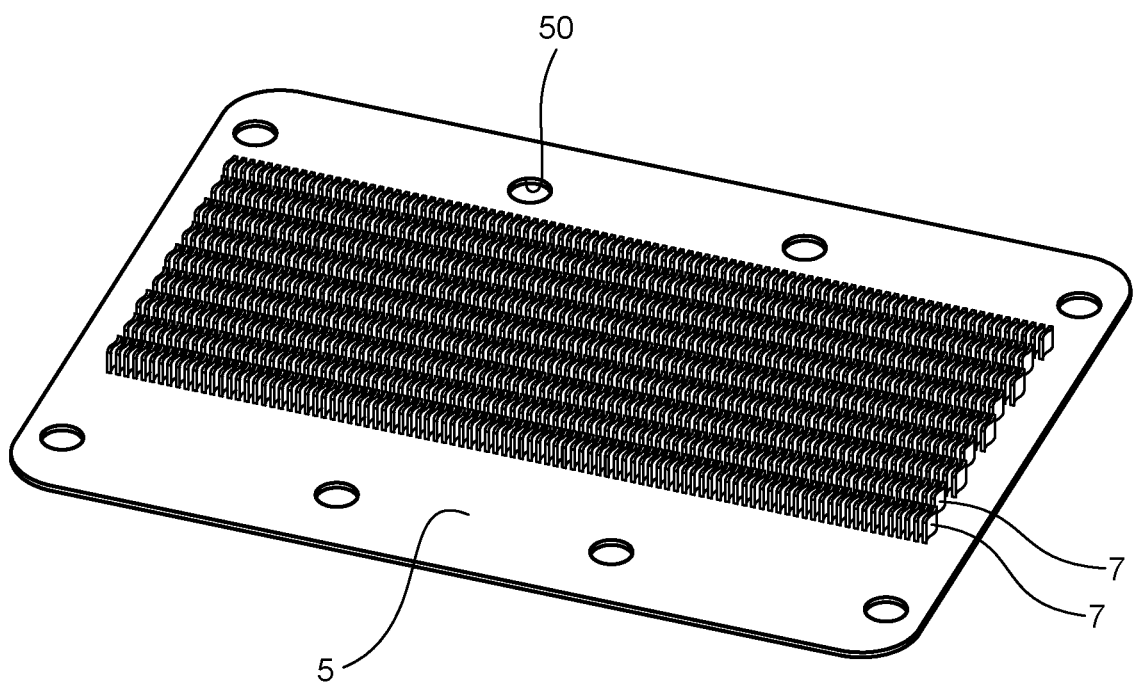
FIG. 2 is a perspective view of a base plate and fins of the present embodiment.
Figure 2:
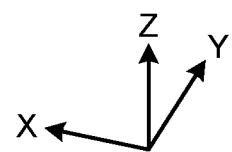
Figure 3:
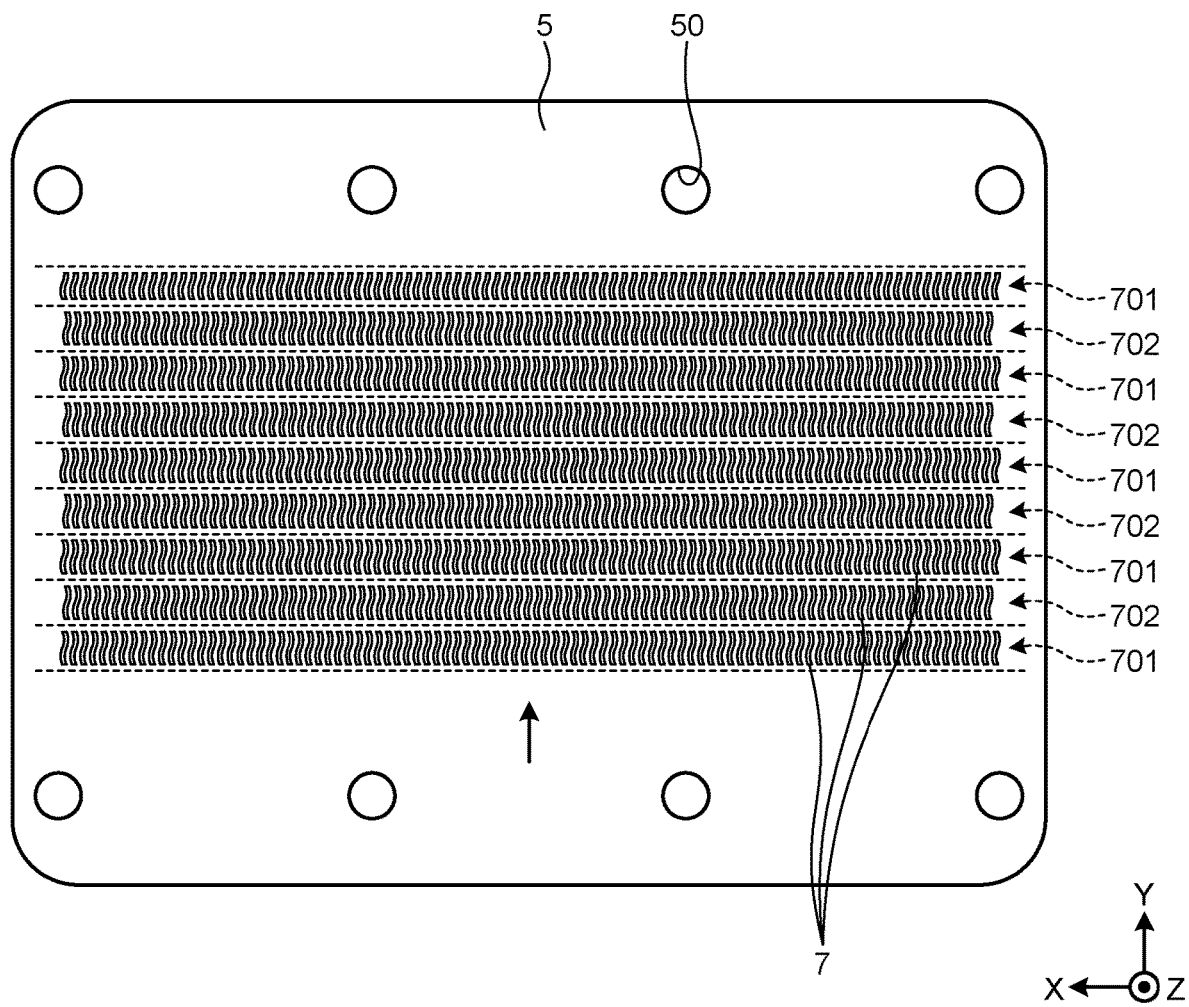
FIG. 3 is a plan view of the base plate and the fins of the present embodiment.
Figure 4:
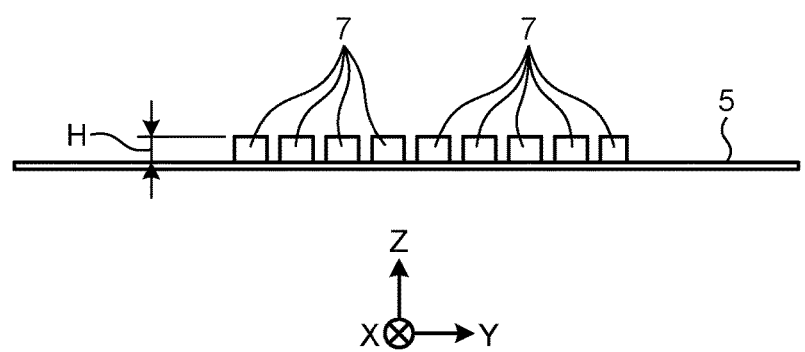
FIG. 4 is a right side view of the base plate and the fins of the present embodiment.
Figure 5:
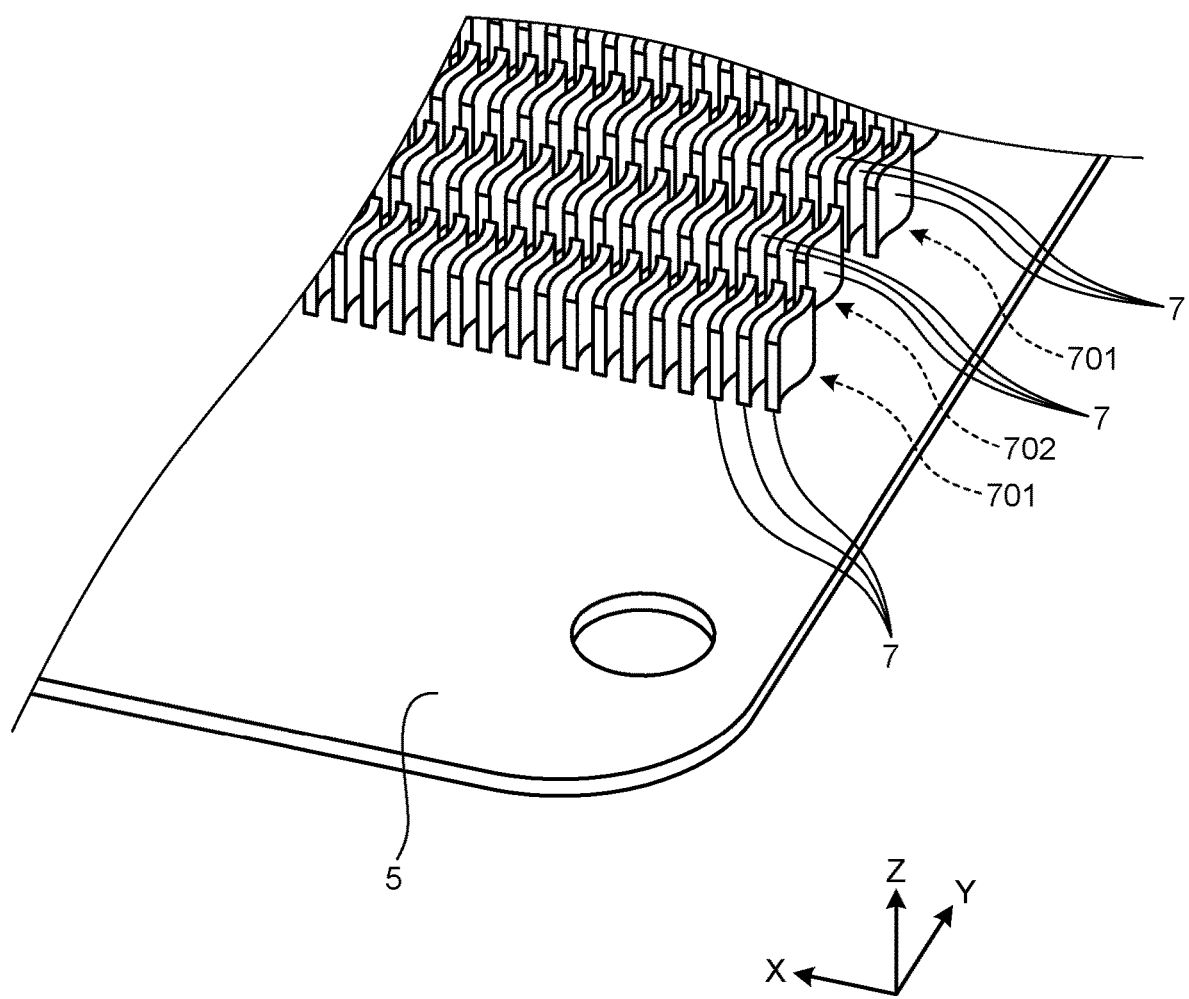
FIG. 5 is an enlarged view of a part of FIG. 2.
Figure 6:
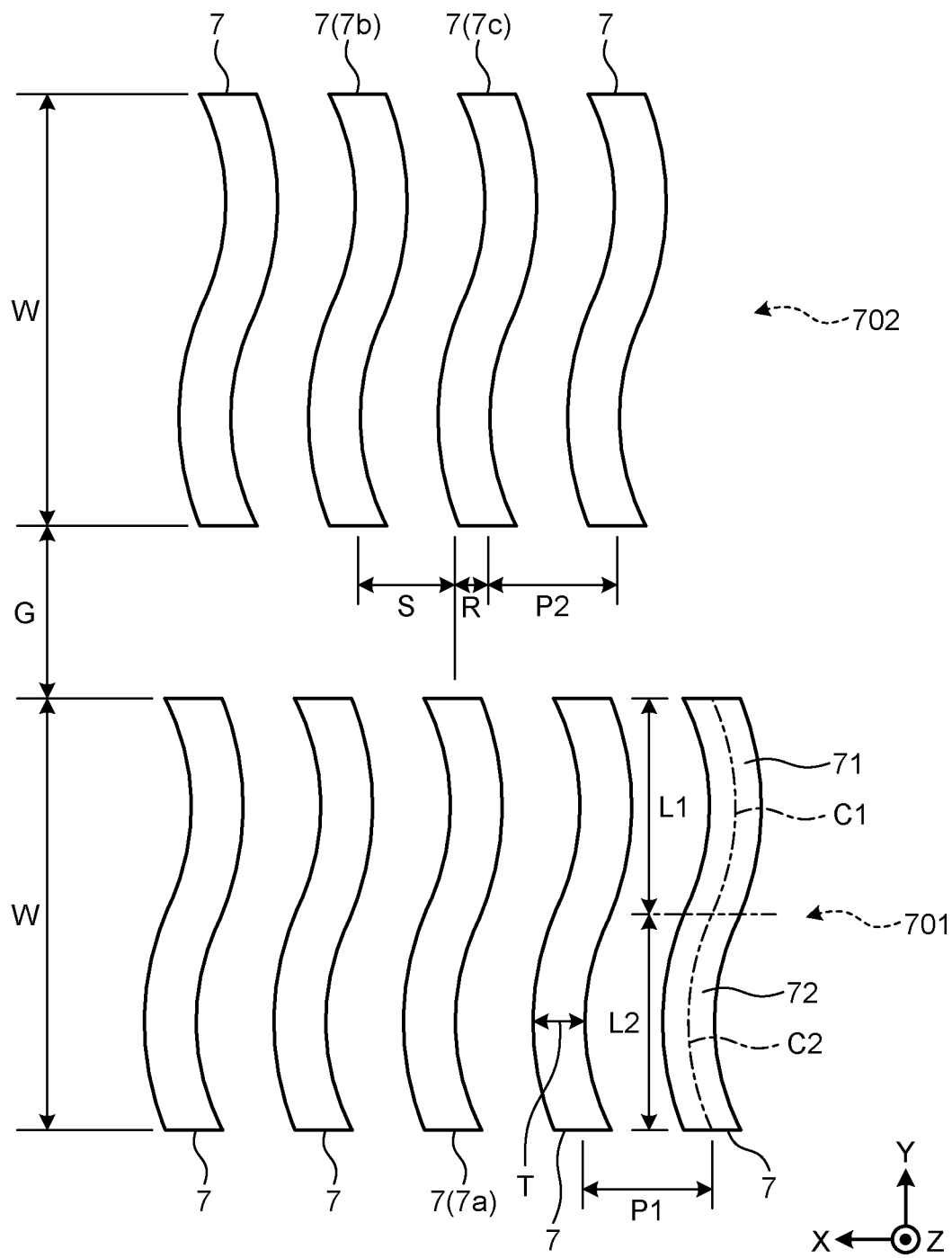
FIG. 6 is an enlarged view of a part of FIG. 3.

FIG. 1 is a perspective view of a heat sink of the present embodiment. FIG. 2 is a perspective view of a base plate and fins of the present embodiment. FIG. 3 is a plan view of the base plate and the fins of the present embodiment. FIG. 4 is a right side view of the base plate and the fins of the present embodiment. FIG. 5 is an enlarged view of a part of FIG. 2. FIG. 6 is an enlarged view of a part of FIG. 3.

A heat sink 1 of the present embodiment is an apparatus used as a cooling device of an electronic device having semiconductor elements, for example. The heat sink 1 is attached to the electronic device and dissipates heat generated in the electronic device. Examples of the semiconductor elements include a power Metal-Oxide-Semiconductor Field-Effect Transistor (MOSFET), Insulated Gate Bipolar Transistor (IGBT), and the like.

As illustrated in FIG. 1 and FIG. 2, the heat sink 1 includes a base plate 5, a cover 3, and a plurality of fins 7. For example, the electronic device that is an object to be cooled is attached to the base plate 5.

As illustrated in FIG. 2, the base plate 5 is formed in a plate-like shape. The base plate 5 is made of metal containing aluminum, for example. More specifically, the base plate 5 is an aluminum alloy (JIS A6063) containing magnesium and silicon. The magnesium content in the aluminum alloy is 0.6% or less, for example. Examples of other aluminum alloys include JIS A1050, JIS A3003, and the like. The thickness of the base plate 5 is approximately 1 mm, for example. The base plate 5 includes a plurality of mounting holes 50.

As illustrated in FIG. 1, the cover 3 overlaps the base plate 5. The cover 3 is made of the same material as that of the base plate 5, for example. The cover 3 includes a case portion 31 and flange portions 32. The case portion 31 is formed in a substantially rectangular parallelepiped shape, for example. A space is formed between the case portion 31 and the base plate 5. The case portion 31 includes a refrigerant introduction hole 11 and a refrigerant discharge hole 12. The refrigerant discharge hole 12 is provided on a face on the opposite side to the face on which the refrigerant introduction hole 11 out of the case portion 31 is provided. The flange portions 32 are in contact with the base plate 5. The flange portions 32 include a plurality of mounting holes 30. The mounting holes 30 overlap the mounting holes 50 of the base plate 5. The cover 3 is fixed to the base plate 5 by bolts that run through the mounting holes 50 and the mounting holes 30 and nuts.

The inside of the case portion 31 is supplied with refrigerant. The refrigerant is introduced into the inside of the case portion 31 via the refrigerant introduction hole 11. The refrigerant is discharged from the case portion 31 via the refrigerant discharge hole 12. The refrigerant is water, for example. The refrigerant receives the heat, which has been generated in the electronic device, inside the case portion 31 and then is discharged to the outside of the case portion 31. This facilitates the heat dissipation of the electronic device.

In the following description, an XYZ rectangular coordinate system is used. The X-axis is parallel to the base plate 5 and is perpendicular to a straight line running through the refrigerant introduction hole 11 and the refrigerant discharge hole 12. The Y-axis is parallel to the base plate 5 and is perpendicular to the X-axis. There may be cases in which the X direction is referred to as a first direction and the Y direction is referred to as a second direction. The Z-axis is perpendicular to both the X-axis and the Y-axis. A direction along the X-axis is described as the X direction, a direction along the Y-axis is described as the Y direction, and a direction along the Z-axis is described as the Z direction. A direction from the refrigerant introduction hole 11 toward the refrigerant discharge hole 12 is defined as a + (plus) Y direction. A direction from the base plate 5 toward the cover 3 is defined as a + (plus) Z direction. When viewed in the + (plus) Y direction in a case where the + (plus) Z direction is upward, the left direction is defined as a + (plus) X direction. The direction that is parallel to the straight line running through the refrigerant introduction hole 11 and the refrigerant discharge hole 12, that is, the Y direction, is defined as an inflow direction of the refrigerant. More specifically, the inflow direction of the refrigerant is the + (plus) Y direction. The inflow direction of the refrigerant is a direction of an arrow indicated on the base plate 5 in FIG. 3.

The fins 7 project in the + (plus) Z direction from the base plate 5. The fins 7 are located in a space between the base plate 5 and the cover 3. That is, the fins 7 are located inside the cover 3. The fins 7 are made of the same material as that of the base plate 5 and are integral with the base plate 5. For example, the base plate 5 and the fins 7 are shaped by shaving off an original plate of aluminum alloy. That is, the base plate 5 and the fins 7 are shaped by skiving. The fins 7 are formed in a plate-like shape. The longitudinal direction of the fins 7 when viewed from the Z direction is along the Y-axis. Although the longitudinal direction of the fins 7 is along the Y-axis, it does not necessarily need to be parallel to the Y-axis and may have an angle with respect to the Y-axis. Specifically, the angle that the longitudinal direction of the fins 7 forms with the Y-axis is preferably greater than or equal to 0 degrees but less than or equal to 30 degrees and more preferably greater than or equal to 0 degrees but less than or equal to 10 degrees. The lateral direction of the fins 7 when viewed from the Z direction is along the X-axis.

As illustrated in FIG. 3, the heat sink 1 includes first fin groups 701 and second fin groups 702. The first fin group 701 is composed of a plurality of fins 7 arranged in the X direction. In the first fin group 701, the fins 7 are arranged at equal intervals in the X direction. The second fin group 702 is composed of a plurality of fins 7 arranged in the X direction. In the second fin group 702, the fins 7 are arranged at equal intervals in the X direction. Although the longitudinal direction of the fins 7 belonging to the second fin group 702 is parallel to the longitudinal direction of the fins 7 belonging to the first fin group 701, it does not necessarily need to be parallel. For example, the longitudinal direction of fins 7 belonging to the second fin group 702 and the longitudinal direction of the fins 7 belonging to the first fin group 701 may be symmetric with respect to the Y-axis.

As illustrated in FIG. 3, the second fin group 702 is adjacent to the first fin group 701 in the Y direction with a gap therebetween. For example, the first fin group 701 and the second fin group 702 are arranged alternately in the Y direction. That is, the second fin group 702 is located between two first fin groups 701. The first fin groups 701 and the second fin groups 702 are both arranged at equal intervals in the Y direction. Between the fins 7 belonging to the first fin group 701 and the fins 7 belonging to the second fin group 702, a gap is provided. The gap length G between the first fin group 701 and the second fin group 702 is preferably less than or equal to 3 mm and more preferably less than or equal to 2 mm. If the gap length G exceeds 3 mm, the space in which the fins 7 stand is lessened, and the number of fins 7 that can stand on the base plate 5 is reduced, whereby the cooling capacity decreases.

As illustrated in FIG. 6, the pitch P2 of the fins 7 in the second fin group 702 is equal to the pitch P1 of the fins 7 in the first fin group 701. Each of the pitch P1 and the pitch P2 is a distance between the centers of gravity of the fins 7 adjacent in the X direction. In the following description, the pitch P1 and the pitch P2 will be described as pitch P, when there is no need to distinguish them from each other. The pitch P is preferably greater than or equal to 0.5 mm but less than or equal to 2 mm. The pitch P is 1.5 mm, for example. If the pitch P is greater than 2 mm, the contact area between the refrigerant and the fin 7 is reduced and the cooling capacity decreases. Conversely, if the pitch P is below 0.5 mm, the refrigerant becomes difficult to flow, and the flow rate of the refrigerant is reduced, whereby the cooling capacity decreases. It also becomes difficult to shave the fins 7. Moreover, assuming that the value of the ratio of the gap length G to the pitch P is G/P, the G/P is preferably 6 or less and more preferably 4 or less. The G/P is 1.33, for example.

The position in the X direction of the fin 7 belonging to the second fin group 702 is displaced with respect to the position in the X direction of the fin 7 belonging to the first fin group 701. Specifically, the position in the X direction of the fin 7 belonging to the second fin group 702 is displaced between the adjacent fins 7 out of the fins 7 belonging to the first fin group 701. The displacement amount S in the X direction between the fins 7 belonging to the first fin group 701 and the fins 7 belonging to the second fin group 702 is less than the pitch P. As illustrated in FIG. 6, the displacement amount S is a difference between the pitch P2 and a distance R. The distance R is a distance in the X direction between the center of gravity of the fin 7 (for example, fin 7a illustrated in FIG. 6) of the first fin group 701 and the center of gravity of the fin 7 (fin 7c) of the second fin group 702 closest to the fin 7a. That is, the displacement amount S is a distance in the X direction between the fin 7a and the fin 7 (fin 7b) of the second fin group 702 that is the second closest to the fin 7a. For example, when the pitch P is 1.5 mm, the displacement amount S is 1.1 mm, and the distance R is 0.4 mm. The distance R is preferably greater than or equal to 1/10 times the pitch P but less than or equal to 1/2 times the pitch P. The distance R is more preferably greater than or equal to 1/5 times the pitch P but less than or equal to 2/5 times the pitch P. That is, assuming that the value of the ratio of the distance R to the pitch P is R/P, the R/P is preferably greater than or equal to 1/10 but less than or equal to 5/10. The R/P is more preferably greater than or equal to 2/10 but less than or equal to 4/10. As the R/P is in the above-described range, the flow of the refrigerant becomes easier to be turbulent and the cooling efficiency is thereby improved.

As illustrated in FIG. 6, the gap length G between the first fin group 701 and the second fin group 702 is greater than the pitch P. In other words, the gap length G is the distance in the Y direction between the fins 7 belonging to the first fin group 701 and the fins 7 belonging to the second fin group 702.

As illustrated in FIG. 6, the fin 7 is curved when viewed from the Z direction. That is, the fin 7 has a waveform shape. The fin 7 includes a first curved portion 71 and a second curved portion 72. The first curved portion 71 is curved so as to project in a – (minus) X direction. The second curved portion 72 is curved so as to project in the + (plus) X direction. The second curved portion 72 is curved opposite in direction to the first curved portion 71. That is, when viewed from the Z direction, the fin 7 is substantially S-shaped. The curvature radius of a center line C2 of the second curved portion 72 when viewed from the Z direction is equal to the curvature radius of a center line C1 of the first curved portion 71 when viewed from the Z direction. The curvature radius of the center line C1 and the curvature radius of the center line C2 are 3 mm, for example, and are preferably greater than or equal to 1 mm but less than or equal to 5 mm. A length L1 in the Y direction of the first curved portion 71 is 2.5 mm, for example. A length L2 in the Y direction of the second curved portion 72 is 2.5 mm, for example.

The thickness T of the fin 7 is constant. The thickness T is the length of the fin 7 in the direction perpendicular to the tangent lines of arcs drawn by the fin 7 when viewed from the Z direction. The thickness T is greater than or equal to ⅓ times the pitch P but less than or equal to ½ times the pitch P. The thickness T is less than the displacement amount S. The thickness T is 0.6 mm, for example. The length L1 of the first curved portion 71 and the length L2 of the second curved portion 72 are preferably greater than or equal to 0.2 times the thickness T but less than or equal to 1 time the thickness T. The width W (length in the Y direction) of the fin 7 is 5 mm, for example. Assuming that the value of the ratio of the length L1 to the width W is L1/W and that the value of the ratio of the length L2 to the width W is L2/W, the L1/W and the L2/W are ½. As illustrated in FIG. 4, the height H (length in the Z direction) of the fin 7 is 4 mm, for example. Assuming that the value of the ratio of the gap length G to the width W is G/W, the G/W is preferably less than or equal to 1, more preferably less than or equal to 0.6, and further preferably less than or equal to 0.4. If the G/W is high, the surface area of the fin 7 is reduced and the cooling capacity decreases.

Figure 7:
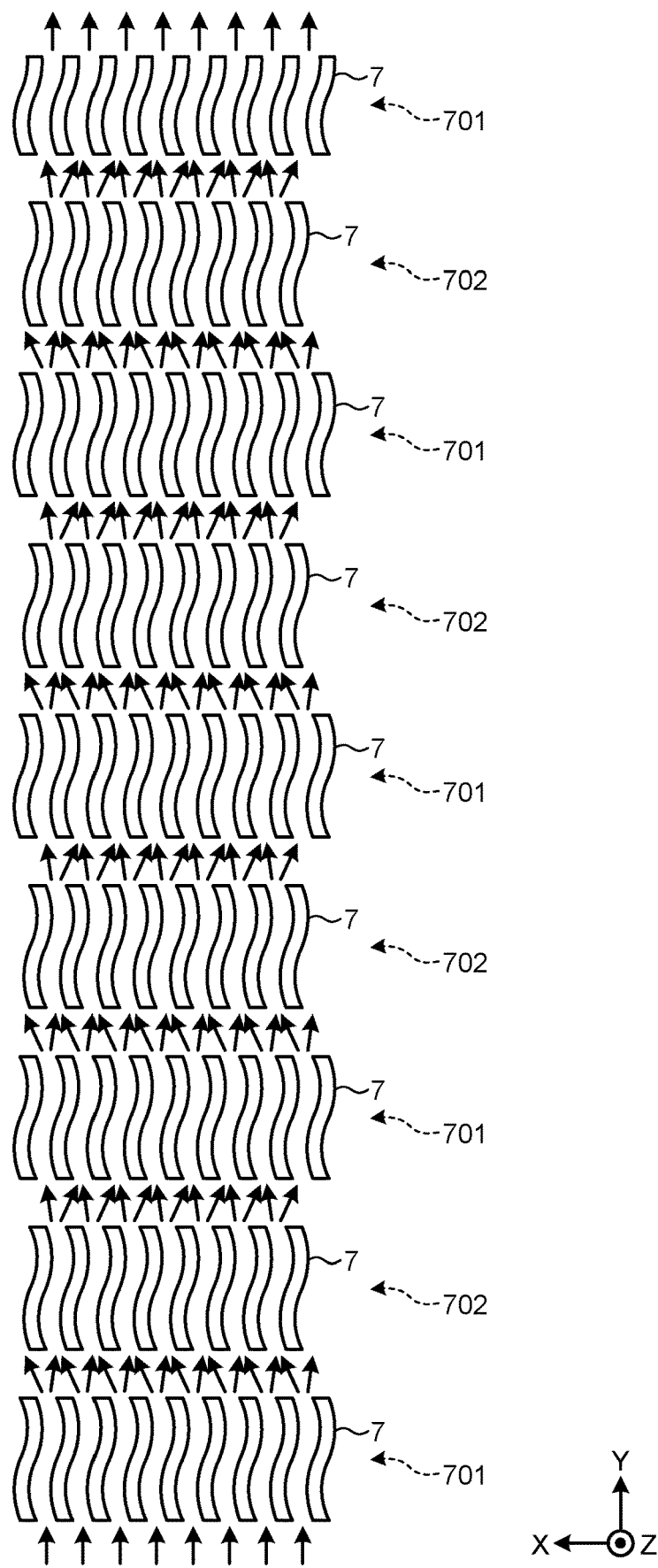
FIG. 7 is a schematic diagram illustrating the flow of refrigerant in the heat sink.

FIG. 7 is a schematic diagram illustrating the flow of refrigerant in the heat sink. The refrigerant supplied to the inside of the case portion 31 illustrated in FIG. 1 passes between a plurality of fins 7. As the refrigerant comes in contact with the fins 7, the heat transferred from the electronic device to the fins 7 is absorbed by the refrigerant. As in the foregoing, there is a gap between the first fin group 701 and the second fin group 702. Consequently, as illustrated in FIG. 7, the refrigerant that has passed between two fins 7 and the refrigerant that has passed between other two fins 7 are merged at the gap between the first fin group 701 and the second fin group 702 as indicated by arrows. In addition, the fins 7 belonging to the second fin group 702 are displaced in the X direction with respect to the fins 7 of the first fin group 701. This causes the refrigerant that has been merged after passing through the first fin group 701 to hit the fins 7 of the second fin group 702 and to be parted again. Thus, the flow of the refrigerant in the case portion 31 becomes easier to be turbulent. As a result, the heat transfer from the fins 7 to the refrigerant is facilitated.

The refrigerant introduction hole 11 and the refrigerant discharge hole 12 do not necessarily need to be at the above-described locations. For example, the refrigerant introduction hole 11 or the refrigerant discharge hole 12 may be arranged on a surface perpendicular to the Z-axis out of the case portion 31. Furthermore, the case portion 31 may include a plurality of refrigerant introduction holes 11 and a plurality of refrigerant discharge holes 12.

The first fin group 701 and the second fin group 702 do not necessarily need to be arranged alternately over the entire range in which the fins 7 are arranged. At least, in a part of the range in which the fins 7 are arranged, the second fin group 702 only needs to be adjacent in the Y direction to the first fin group 701. For example, a plurality of second fin groups 702 may be present between two first fin groups 701 or a plurality of first fin groups 701 may be present between two second fin groups 702.

The fin 7 does not necessarily need to have the above-described shape. For example, the second curved portion 72 may be curved in the same direction as that of the first curved portion 71. For example, the fin 7 does not need to be provided with the first curved portion 71 nor the second curved portion 72. For example, the fin 7 may only have either one of the first curved portion 71 and the second curved portion 72. For example, the fin 7 may have a third curved portion, in addition to the first curved portion 71 and the second curved portion 72. The fin 7 may have curved portions of three or more, within a manufacturable range. The lengths in the Y direction of the curved portions may be different from one another. The fin 7 does not need to be provided with a curved portion and be linear.

The above-described values of the gap length G, the height H, the pitch P1, the pitch P2, the thickness T, and the width W illustrated in FIG. 4 and FIG. 6 are mere examples. Each of the values does not necessarily need to be the above-described value.

As in the foregoing, the heat sink 1 includes the base plate 5, the cover 3, the fins 7, the first fin groups 701, and the second fin groups 702. The cover 3 overlaps the base plate 5. The fins 7 are plate-like members projecting from the base plate 5 in the direction perpendicular to the base plate 5 and located between the base plate 5 and the cover 3. The first fin group 701 is composed of a plurality of fins 7 arranged with a gap therebetween in the first direction (X direction) parallel to the base plate 5. The second fin group 702 is composed of a plurality of fins 7 arranged with a gap therebetween in the first direction (X direction) and is adjacent to the first fin group 701 with a gap therebetween in the second direction (Y direction) parallel to the inflow direction of the refrigerant. The longitudinal direction of the fin 7 is along the second direction. The fins 7 belonging to the second fin group 702 are arranged in the second direction (Y direction) with respect to the fins 7 belonging to the first fin group 701 with a gap therebetween. The positions in the first direction (X direction) of the fins 7 belonging to the second fin group 702 are displaced with respect to the positions in the first direction (X direction) of the fins 7 belonging to the first fin group 701.

With this configuration, the refrigerant that has passed between two fins 7 and the refrigerant that has passed between other two fins 7 are merged at the gap between the first fin group 701 and the second fin group 702. Moreover, the refrigerant that has been merged at the gap between the first fin group 701 and the second fin group 702 hits the fin 7 located downstream of the gap, whereby the refrigerant is parted again. As the merging and parting of the refrigerant are repeated, the flow of the refrigerant becomes easier to be turbulent. As a result, the heat sink 1 can improve cooling efficiency.

In the heat sink 1, the fin 7 includes the first curved portion 71 projecting in the first direction (X direction) and the second curved portion 72 projecting opposite in direction to the first curved portion 71. With this configuration, the flow of the refrigerant between the fins 7 becomes easier to be turbulent. As a result, the cooling efficiency of the heat sink 1 is further improved.

In the heat sink 1, the base plate 5 and the fins 7 are made of metal containing aluminum. As a result, the heat generated in the object to be cooled becomes easier to be transferred to the fins 7, whereby the cooling efficiency of the heat sink 1 is further improved.

What is claimed is:

1. A heat sink comprising:
    a base plate;
    a cover overlapping the base plate;
    fins, each having a plate-like shape projecting from the base plate in a direction perpendicular to the base plate, the fins being located between the base plate and the cover;
    one or a plurality of first fin groups composed of a plurality of the fins arranged with a gap therebetween in a first direction parallel to the base plate; and
    one or a plurality of second fin groups composed of a plurality of the fins arranged with a gap therebetween in the first direction, and adjacent to the first fin group with a gap therebetween in a second direction parallel to an inflow direction of refrigerant and perpendicular to the first direction, wherein
    a longitudinal direction of the fins is along the second direction,
    positions in the first direction of the fins belonging to the second fin group are displaced with respect to positions in the first direction of the fins belonging to the first fin group,
    each of the fins has an S-shape having a first curved portion which is curved to project to one side in the first direction, and a second curved portion which is curved to project to another side opposite to the one side in the first direction,
    the gap between the fins in the first group and the second fin group has an inlet portion and an outlet portion in the second direction, which are located on one line perpendicular to the first direction, and
    a pitch P and a distance R are set $1/10 \leq R/P \leq 5/10$, where the pitch P is a distance, in the first direction, between centers of gravity of the fins adjacent to each other in the first fin group and between centers of gravity of the fins adjacent to each other in the second fin group, and the distance R is a difference, in the first direction, between a center of gravity of the fin in the first fin group and a center of gravity of the fin in the second fin group closest to the fin in the first fin group.

2. The heat sink according to claim 1, wherein the pitch P and the distance R are set $1/5 \leq R/P \leq 2/5$.

3. The heat sink according to claim 1, wherein the pitch P and a length G are set G>P, where the length G is a distance between the fins in the first fin group and the fins in the second fin group.

4. A heat sink comprising:
    a base plate;
    a cover overlapping the base plate;
    fins, each having a plate-like shape projecting from the base plate in a direction perpendicular to the base plate, the fins being located between the base plate and the cover;
    one or a plurality of first fin groups composed of a plurality of the fins arranged with a gap therebetween in a first direction parallel to the base plate; and
    one or a plurality of second fin groups composed of a plurality of the fins arranged with a gap therebetween in the first direction, and adjacent to the first fin group with a gap therebetween in a second direction parallel to an inflow direction of refrigerant and perpendicular to the first direction, wherein
    a longitudinal direction of the fins is along the second direction,
    positions in the first direction of the fins belonging to the second fin group are displaced with respect to positions in the first direction of the fins belonging to the first fin group,
    each of the fins has an S-shape having a first curved portion which is curved to project to one side in the first direction, and a second curved portion which is curved to project to another side opposite to the one side in the first direction,
    the gap between the fins in the first group and the second fin group has an inlet portion and an outlet portion in the second direction, which are located on one line perpendicular to the first direction, and
    the pitch P and a length G are set G>P, where the length G is a distance between the fins in the first fin group and the fins in the second fin group and the pitch P is a distance, in the first direction, between centers of gravity of the fins adjacent to each other in the first fin group and between centers of gravity of the fins adjacent to each other in the second fin group.

* * * * *